(12) United States Patent
Lee et al.

(10) Patent No.: US 6,775,170 B2
(45) Date of Patent: Aug. 10, 2004

(54) SEMICONDUCTOR MEMORY DEVICE HAVING WRITE COLUMN SELECT LINE OR READ COLUMN SELECT LINE FOR SHIELDING SIGNAL LINE

(75) Inventors: Yun-Sang Lee, Kyungki-do (KR); Won-Chang Jung, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/222,110

(22) Filed: Aug. 16, 2002

(65) Prior Publication Data

US 2003/0133332 A1 Jul. 17, 2003

(30) Foreign Application Priority Data

Jan. 16, 2002 (KR) .............................................. 02-2510

(51) Int. Cl.[7] .................................................. G11C 7/02
(52) U.S. Cl. ........................... 365/53; 365/63; 365/191; 365/230.06
(58) Field of Search ...................... 365/53, 63, 230.06, 365/191

(56) References Cited

U.S. PATENT DOCUMENTS 4,984,202 A * 1/1991 Kawahara et al. .......... 365/177
5,966,326 A * 10/1999 Park et al. ............. 365/185.11
6,212,091 B1 * 4/2001 Kawabata et al. ............ 365/63

FOREIGN PATENT DOCUMENTS

JP    2001014854    1/2001

OTHER PUBLICATIONS

English language abstract of Japanese Patent No. 2001014854.

* cited by examiner

*Primary Examiner*—Hoai Ho
(74) *Attorney, Agent, or Firm*—Marger Johnson & McCollom, P.C.

(57) ABSTRACT

A semiconductor memory device comprises a write column select line or read column select line for shielding a signal line. The semiconductor memory device may include a signal line, a read column select line, and a write column select line. The signal line may transmit an operation signal related to the operation of the semiconductor memory device. The read column select line may transmit a read column select signal, which may control transfer of a data signal of a bit line to a data line. The write column select line may transmit a write column select signal, which may control transfer of the data signal of the data line to the bit line. One of the read column select line and the write column select line to transmit a deactivated column select signal among the read column select signal and the write column select signal, may be maintained at a predetermined logic level and may shield the signal line.

9 Claims, 6 Drawing Sheets

```
NS0        ─────────────────────────────

WRITE CSL0 ─────────────────────────────

D          ─────────────────────────────

/D         ─────────────────────────────

WRITE CSL1 ─────────────────────────────

NS1        ─────────────────────────────
```

D
/D
NS

READ CSL0 ──────────────
WRITE CSL0 ──────────────
D ──────────────
/D ──────────────
READ CSL1 ──────────────
WRITE CSL1 ──────────────

FIG. 7

READ CSL0 ─────────────

WRITE CSL0 ─────────────

D ─────────────

/D ─────────────

WRITE CSL1 ─────────────

READ CSL1 ─────────────

FIG. 8

WRITE CSL0 ─────────────

READ CSL0 ─────────────

D ─────────────

/D ─────────────

READ CSL1 ─────────────

WRITE CSL1 ─────────────

SEMICONDUCTOR MEMORY DEVICE HAVING WRITE COLUMN SELECT LINE OR READ COLUMN SELECT LINE FOR SHIELDING SIGNAL LINE

This application claims benefit and priority of Korean Patent Application No. 2002-2510, filed Jan. 16, 2002, the contents of which are herein incorporated by reference in their entirety.

BACKGROUND

The present invention relates to a semiconductor memory device, and more particularly, to a semiconductor memory device having a write column select line or read column select line for shielding a signal line.

In a conventional semiconductor memory device, a signal line related to the operation of a semiconductor memory device, which is sensitive to the effect of the coupling capacitance of an adjacent signal line, is shielded with a power supply voltage line or ground voltage line for maintaining a stable voltage level and thus may provide for a stable signal property. A shielding line, such as the power supply voltage line or ground voltage line, may be arranged in a core region, which may include a memory cell array of the semiconductor memory device. Accordingly, a layout area of the semiconductor memory device might have to be increased in order to accommodate the shielding line.

In order to solve problems related to chip size and fast operating speeds, current mode signaling may be used instead of voltage mode signaling for conventional semiconductor memory devices, i.e., dynamic random access memory (DRAM). In the case of using current mode signaling, coupling of noise may occur due to a coupling capacitance between signal lines. That is, a signal of small voltage swings of, e.g., a several tens to several hundreds of millivolts (mV), may be affected by noise coupled thereto from an adjacent signal line. Such noise coupling may cause the memory device to malfunction.

FIGS. 1A and 1B illustrate how a signal of one line may cause a malfunction on another adjacent line due to the coupling of noise from one line to the other. Referring to FIGS. 1A and 1B, a differential pair of signal lines D and /D may carry a differential signal of a small-swing of voltage difference ΔV. The differential signal may be influenced by noise from an adjacent signal line NS. As a result, the signal of the differential pair D and /D may be corrupted to cause an invalid sensing operation marked by CASE1. One method of propagating a signal along a pair of differential signal lines D and /D may use current mode signaling. The voltage swing between the differential signal lines D and /D may be only several tens to several hundreds of millivolts (mV) and may be smaller than that of a CMOS voltage level.

FIGS. 2A and 2B simplistically illustrate a conventional protective measure that may be used for preventing corruption of the signal of the signal line of FIG. 1A. Referring to FIGS. 2A and 2B, to guard against invalid sensing of a signal of the pair of differential signal lines D and /D, the lines D and /D may be arranged to cross one another along their length. This arrangement may allow each of the differential signal lines D and /D to be equally affected by the coupling of noise from adjacent signal line NS. Ideally, the noise would be coupled equally to each of the lines of the differential pair to allow preservation of the differential signal. However, in this conventional arrangement, the effect of the coupling of the noise may be varied according to the relative position of each of the lines D and /D to the noise source. Thus, the conventional arrangement remains susceptible to noise of neighboring lines.

A RAS-to-CAS delay time (tRCD) and a RAS access time (tRAC) represent a couple of alternating current (AC) parameters of a semiconductor memory device. These parameters may reflect an operating speed of the semiconductor memory device and may be established within the core region of the semiconductor memory device. In order to permit improved speeds of operation of the semiconductor memory device, a column select circuit for controlling the input/output of data in the core region may be divided into separate portions operable under the control of a read column select line and write column select line. This method of controlling allows for more rapid transfer of data from within the core to a peripheral circuit when performing a read operation. Likewise, data of the peripheral circuit may also be more quickly transferred to the core region when performing a write operation. These features, thus, assist the speed of operation of the semiconductor memory device.

FIG. 3 is a block diagram illustrating a part of a conventional semiconductor memory device associated with controlling a column select circuit. In this conventional embodiment, the column select circuit is divided into separate portions operable under the control of a read column select line and a write column select line, respectively. The read column select line READ CSL, may be activated responsive to a read operation, while the write column select line WRITE CSL, may be activated responsive to a write operation. Each may be deactivated absent respective read or write operations of the read column select line READ CSL and the write column select line WRITE CSL. Each of the read column select line READ CSL and the write column select line WRITE CSL may be operable to preserve a constant voltage level (for example, of logic low or logic high).

Write column select circuits 32 and 34 may be operative to transfer data from data line pair D and /D, to a bit line pair BL and /BL in response to activation of a write column select signal W_CSL as propagated by the write column select line WRITE CSL. Once transferred to the bit line pair BL and /BL, the data may be stored in a core region 30.

Read column select circuit 31 and 33 may transfer the data of core region 30 from bit line pair BL and /BL to data line pair D and /D in response to activation of a read column select signal R_CSL as propagated by the read column select line READ CSL.

FIG. 4A illustrates layout of column select lines and a data line of the semiconductor memory device such as that of FIG. 3. FIG. 4B is a timing diagram illustrating a potential invalid sensing operation of the data line pair of FIG. 4A. In FIG. 4B, it is assumed that a first read column select line READ CSL0 is activated after the activation of a second read column select line READ CSL1. Referring to FIGS. 4A and 4B, the signal of data line pair D and /D (to be sensed by a sensing operation during the activation of the first read column select line READ CSL0) may be corrupted as shown by the anomaly labeled CASE3 in FIG. 4B. The anomaly of CASE3 may be caused by the coupling of noise, which may be associated with a signal transition of either the first read column select line READ CSL0 or the second read column select line READ CSL1.

SUMMARY

In accordance with an exemplary embodiment of the present invention, a semiconductor memory device may comprise a write column select line or read column select line positioned for shielding a signal line related to operation of the semiconductor memory device.

According to one embodiment of the present invention, a semiconductor memory device comprises a signal line to propagate an operation signal associated with operation of the semiconductor memory device. A read column select line may propagate a read column select signal to control transfer of a data signal of a bit line to a data line. A write column select line may be operable to propagate a write column select signal to control transfer of a data signal of the data line to the bit line. One of the read column select line and the write column select line may be maintained at a predetermined logic level and may shield the signal line.

According a further embodiment of the present invention, the operation signal may comprise a data signal of a voltage smaller than a CMOS voltage level, and the deactivated column select signal may comprise a write column select signal.

According to another embodiment of the present invention, the logic level may comprise one of logic low level or logic high level.

According to another embodiment of the present invention, a semiconductor memory device comprises a signal line for transmitting an operation signal related to the operation of the semiconductor memory device. A read column select line may carry a read column select signal, which may control when to transmit a data signal of a bit line to a data line. A write column select line may carry a write column select signal, which may control when to transmit a data signal of the data line to the bit line. The write column select line may be maintained at a predetermined logic level and may be operable to shield the signal line when the read column select signal is activated.

According to another embodiment of the present invention, a semiconductor memory device comprises a signal line for transmitting an operation signal of the semiconductor memory device. A read column select line may be operable to carry a read column select signal, to control when a data signal of a bit line may be transferred to a data line. A write column select line may be operable to carry a write column select signal, to control when a data signal of the data line may be transferred to the bit line. The read column select line may be maintained at a predetermined logic level and may shield the signal line from transitions of the write column select signal.

According to another exemplary embodiment of the present invention, a semiconductor memory device comprises a signal line for transmitting an operation signal related to operation of the semiconductor memory device. A complementary signal line may be operable to carry a signal complimentary to the operation signal. A plurality of read column select lines may be arranged in parallel with the signal line and the complementary signal line. The plurality may be operable to transmit a read column select signal, which may control when to transmit a data signal of a bit line to a data line. A plurality of write column select lines may be arranged in parallel with the signal line and the complementary signal line between the read column select lines, respectively. The write column select lines may be operable to transmit a write column select signal, to control when to transmit the data signal of the data line to the bit line. The write column select lines may also be maintained at respective predetermined logic levels, and may shield the signal line and the complementary signal line when the read column select signal is activated.

According to another embodiment of the present invention, a semiconductor memory device comprises a signal line to propagate an operation signal of the semiconductor memory device and, a complementary signal line for transmitting a signal complementary to the operation signal. A plurality of write column select lines may be arranged in parallel with the signal line and the complementary signal line. The plurality of write column select lines may be operable to transmit a write column select signal to control transfer of a data signal of a data line to a bit line. A plurality of read column select lines may be arranged in parallel with the signal line and the complementary signal line between the write column select lines, respectively, and may be operable to transmit a read column select signal to control when to transmit the data signal of the bit line into the data line. The read column select lines are to be maintained at a predetermined logic level, respectively, and to shield the signal line and the complementary signal line when the write column select signal is activated.

According to particular embodiments of the present invention, the signal line may be shielded by the write column select lines, and the signal line may maintain stable operation without noise corruption. Additionally, an extra layout area for extra the shielding lines may not be required. Thus, chip size may therefore be reduced relative to that which might otherwise be required with the extra shielding lines.

BRIEF DESCRIPTION OF THE DRAWINGS

Embodiments of the present invention will be described with reference to the attached drawings in which:

FIG. 7 is a layout diagram simplistically illustrating a layout of signal lines in a semiconductor memory device according to another embodiment of the present invention; and FIG. 8 is a layout diagram simplistically illustrating a layout of signal lines in a semiconductor memory device according to a further embodiment of the present invention.

DETAILED DESCRIPTION

Figures 1A, 1B:
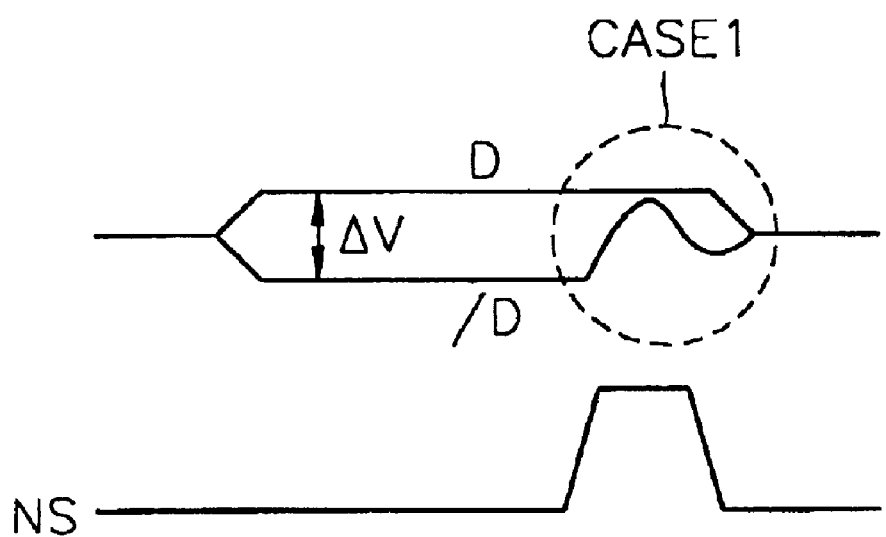
FIGS. 1A and 1B simplistically illustrate a schematic of signal lines and associated signals and how a signal line may be adversely affected by the coupling of noise from an adjacent signal line.
Figure 2A:
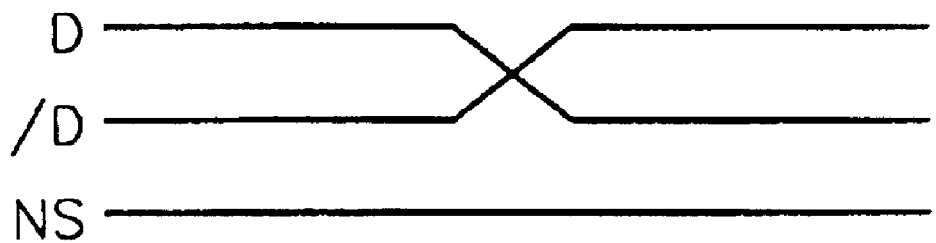
FIGS. 2A and 2B simplistically illustrate a schematic of signal lines and associated coupling performance per a conventional embodiment for protecting against adjacent noise coupling affects.
Figure 2B:
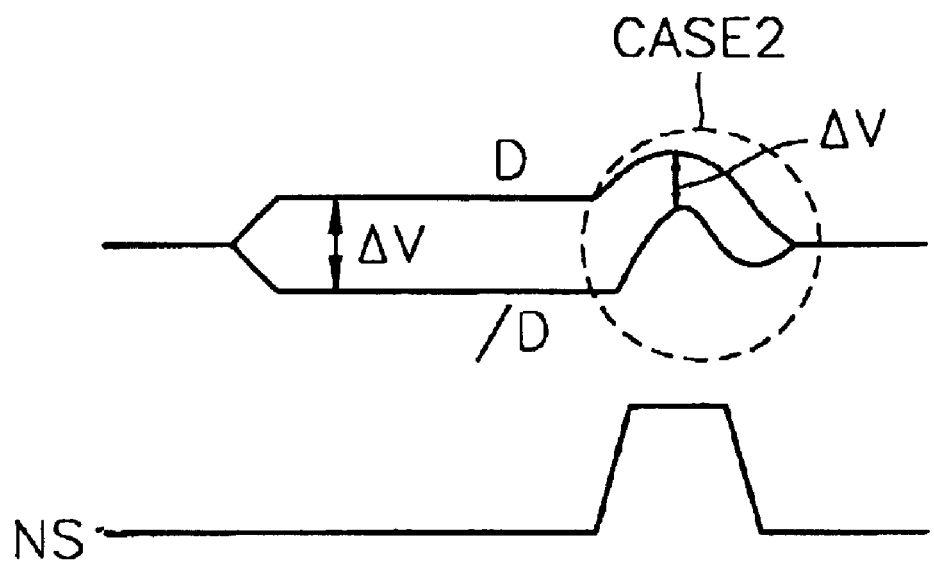
Figure 3:
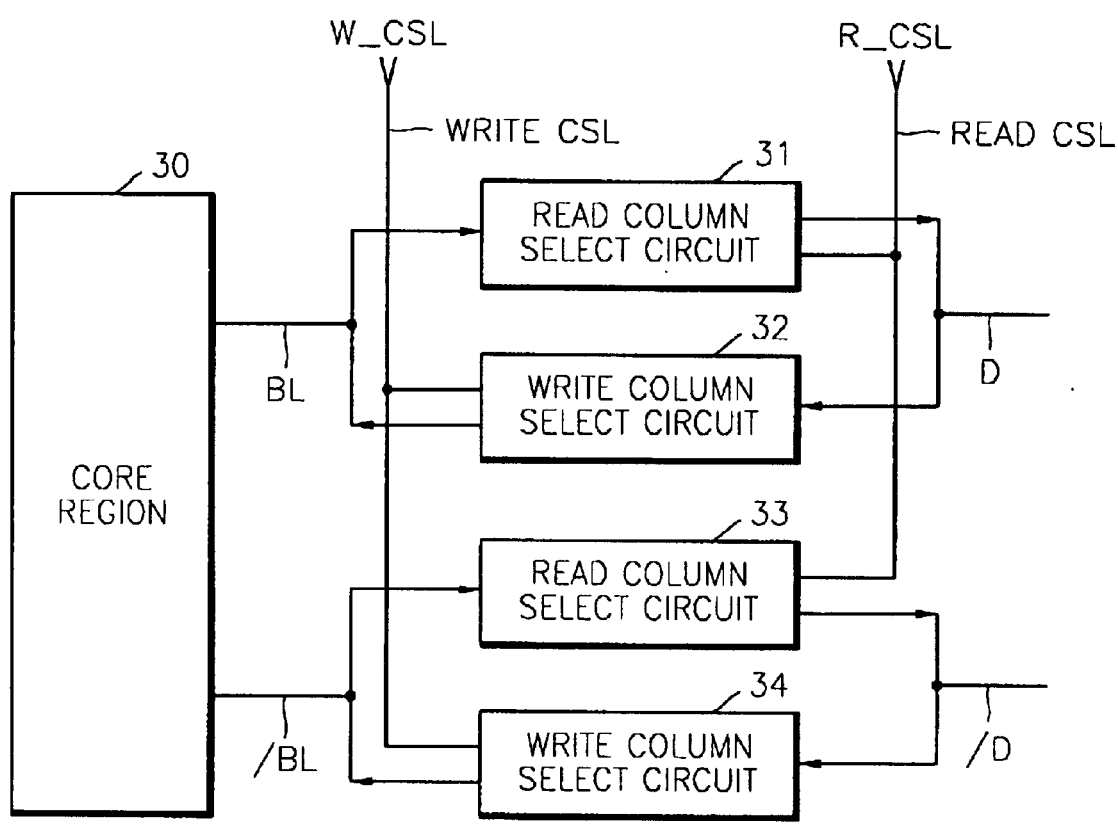
FIG. 3 is a block diagram simplistically illustrating a part of a conventional semiconductor memory device that may be associated with controlling a column select circuit.
Figures 4A, 4B:
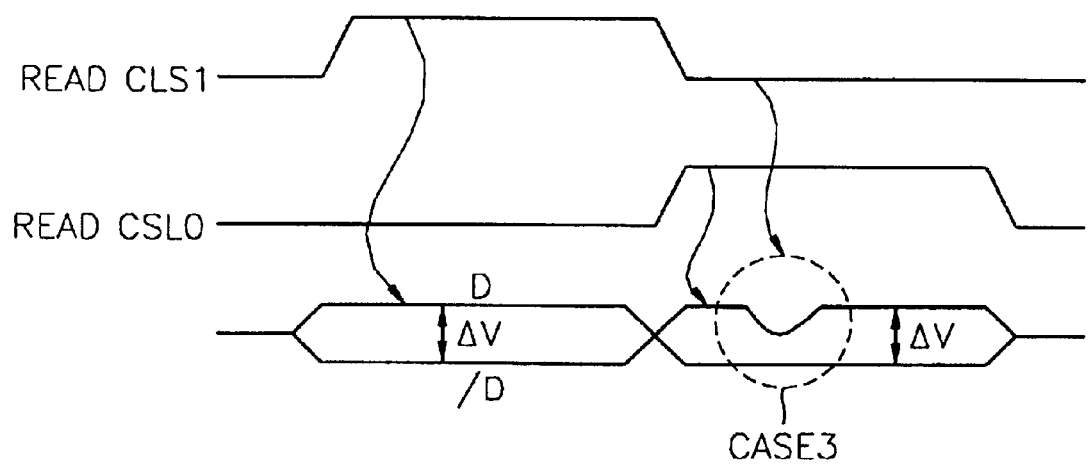
FIG. 4A is a layout diagram simplistically illustrating layout of column select lines and a data line of a semiconductor memory device.
FIG. 4B is a timing diagram for illustrating corruption of a differential signal of a data line pair.
Figure 5:
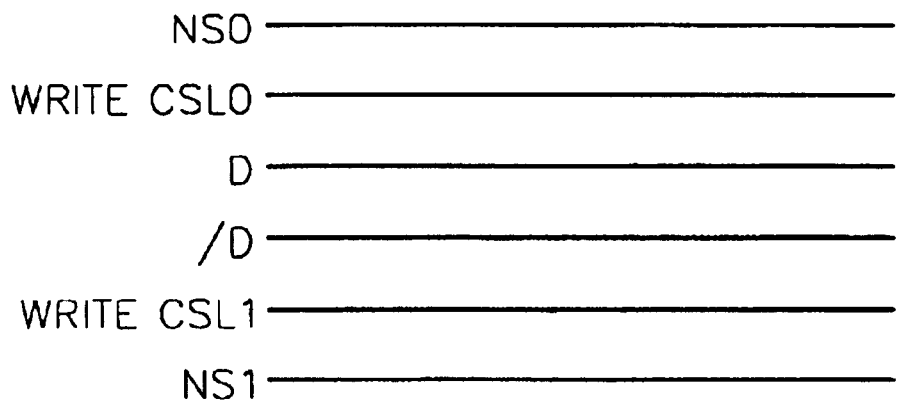
FIG. 5 is a layout diagram simplistically illustrating a layout of signal lines of a semiconductor memory device according to an embodiment of the present invention.

Referencing the simplistic layout diagram of FIG. 5, a semiconductor memory device according to an embodiment of the present invention, comprises signal lines of a structure in which a column select circuit may be divided into a first portion operable under control of write column select line and a second portion operable under control of a read column select line as shown in FIG. 3.

Further referencing FIG. 5, a data line pair D and /D, write column select lines WRITE CSL0 and WRITE CSL1, and adjacent signal lines NS0 and NS1 may be arranged in parallel with one another. The first and second write column select lines WRITE CSL0 and WRITE CSL1 may be deactivated, respectively, when the semiconductor memory device according to an embodiment of the present invention, performs a read operation. They may be maintained at a constant level (for example, logic low or logic high) and may serve as a shielding line.

In a particular embodiment, the first and second write column select lines WRITE CSL0 and WRITE CSL1 may be arranged, respectively, between a first adjacent signal line NS0 and a data line D and between a second adjacent signal line NS1 and a complementary data line /D. With such layout, they may serve to shield the data line pair D and /D from potential noise of the respective first and second adjacent signal lines NS0 and NS1. Thus, the data line pair D and /D may transmit a stable data signal protected from extraneous noise. Although only two write column select lines WRITE CSL0 and WRITE CSL1 are shown in FIG. 5 for the write column select lines of this particular embodiment; it will be understood that, in alternative embodiments, a further plurality of write column select lines may be arranged as the column select lines and shielding lines.

Of the data line pair D and /D, date line D may transfer a data output signal during a read operation. Data line /D may transfer a signal complementary to the data output signal. When the signal transmission along the data line pair D and /D comprises current mode signaling, the associated voltage swing ΔV may only be several tens to several hundreds of millivolts (mV). Such voltage swing may be relatively small in comparison to a CMOS voltage level.

In the particular embodiment described with reference to FIG. 5, a signal line to be shielded is a data line. It will be understood, however, that alternative embodiments may shield a signal line for transmitting an operation signal that may be related to other operations (for example, a read operation) of the semiconductor memory device.

Each of the first and second adjacent signal lines NS0 and NS1, therefore, may be representative of a signal line for transmitting signals which may cause coupling of noise to data line pair D and /D.

Figure 6:
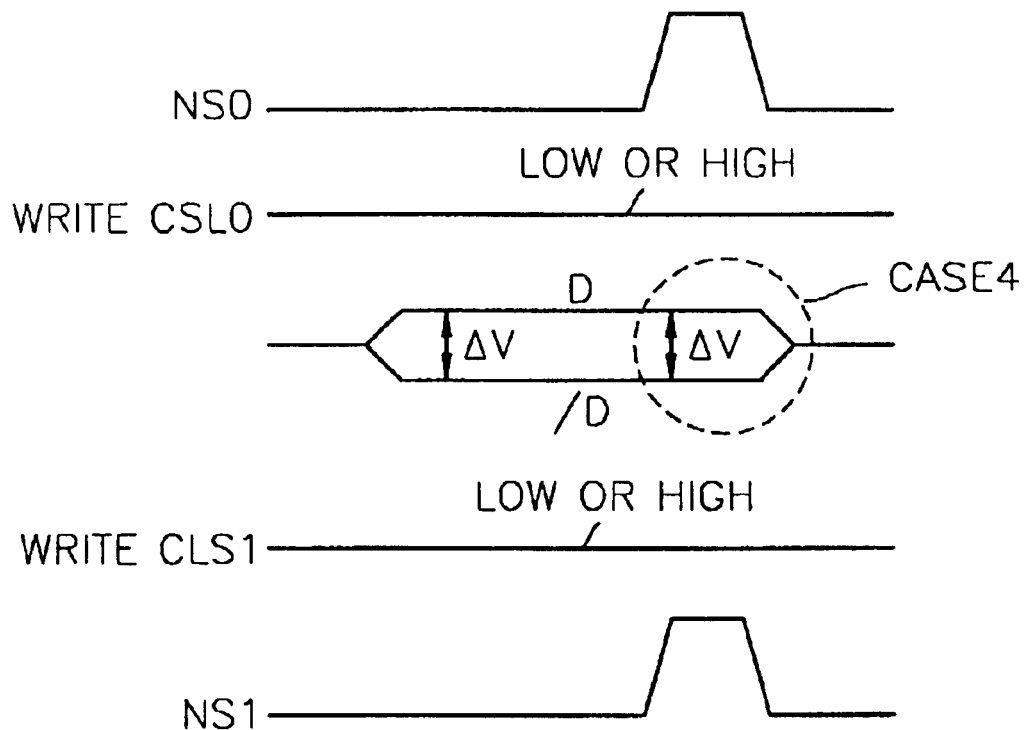
FIG. 6 is a timing diagram simplistically illustrating operation of semiconductor memory device such as that of the layout of FIG. 5.

FIG. 6 is a timing diagram simplistically illustrating an example of an operation of the semiconductor memory device according to the layout of FIG. 5. When reading the semiconductor memory device, according to this embodiment of the present invention and with further reference to FIG. 6, the first and second write column select lines WRITE CSL0 and WRITE CSL1 may be maintained with logic low or logic high levels. Thus, each of these write column select lines WRITE CSL0 and WRITE CSL1 may serve as a shielding line and may block potential noise of adjacent signal lines NS0 and NS1 which might otherwise adversely affect the data line pair D and /D. During a particular interval of time (highlighted as CASE4 in FIG. 6), the data line pair D and /D may be operable to preserve a voltage difference ΔV and may allow for valid sensing operations despite transitions which may be present on adjacent lines NS0, NS1. This may be helpful when the voltage difference ΔV of the data line pair may be relatively small in comparison with CMOS voltage levels, e.g., several tens to several hundreds of millivolts (mV).

FIG. 7 is a simplified layout diagram schematically illustrating a layout of signal lines for a semiconductor memory device according to another embodiment of the present invention. In an exemplary layout of signal lines as shown in FIG. 7, a column select circuit of a semiconductor memory device, e.g., such as that of FIG. 3, may be divided into a first portion operable under control of write column select line and second portion operable under control of a read column select line.

Further referencing FIG. 7, a data line pair D and /D, write column select lines WRITE CSL0 and WRITE CSL1, and read column select lines READ CSL0 and READ CSL1 may be arranged in parallel with one another. This particular embodiment may differ from that described previously herein, compare FIG. 7 to FIG. 5, in that the signal line with the noise may comprise the read column select lines READ CSL0 and READ CSL1.

In this embodiment, therefore and further referencing FIG. 7, the first and second write column select lines WRITE CSL0 and WRITE CSL1 may be deactivated, respectively, during a read operation. These lines may serve as shielding lines while maintaining their constant levels (for example, logic low or logic high). That is, the first and second write column select lines WRITE CSL0 and WRITE CSL1 may be arranged, respectively, between a first read column select line READ CSL0 and a data line D and between a second read column select line READ CSL1 and a complementary data line /D. The first and second write column select lines WRITE CSL0 and WRITE CSL1 may, thus, serve to shield the data line pair D and /D from noise of the first and second read column select lines READ CSL0 and READ CSL1, which might otherwise affect the integrity of a signal of the data lines. Thus, the data line pair D and /D may transmit a stable data signal while shielded from such noise. Although only two write column select lines WRITE CSL0 and WRITE CSL1 are shown in the exemplary embodiment of FIG. 7, it is understood, however, that in alternative embodiments, a plurality of write column select lines may be arranged as such shielding lines.

FIG. 8 is a simplified layout diagram schematically illustrating a layout of signal lines for semiconductor memory device according to another embodiment of the present invention. Referencing FIG. 8, a column select circuit for a semiconductor memory device, e.g., such as that of FIG. 3, may be divided into a portion operable under the control of a write column select line and another portion operable under the control of a read column select line. A data line pair D and /D, write column select lines WRITE CSL0 and WRITE CSL1, and read column select lines READ CSL0 and READ CSL1 may be arranged in parallel with one another. In this embodiment of FIG. 8, in contrast to the embodiment previously described herein relative to FIG. 7, the signal line of potential noise may comprise the write column select lines WRITE CSL0 and WRITE CSL1. The read column select lines READ CSL0 and READ CSL1 therefore, may be disposed to serve as shielding lines to shield the data lines from potential noise of the WRITE column select lines.

During an exemplary write operation, first and second read column select lines READ CSL0 and READ CSL1 may be deactivated and they may serve as shielding lines while being maintained at their constant levels (for example, logic low or logic high). That is, the first and second read column select lines READ CSL0 and READ CSL1 may be arranged, respectively, with one between the first write column select line WRITE CSL0 and a data line D and the other between the second write column select line WRITE CSL1 and a complementary data line /D. With such an arrangement, the read column select lines may serve to shield the data line pair D and /D from potential noise of the first and second write column select lines WRITE CSL0 and WRITE CSL1. Thus, the data line pair D and /D may be operable to transmit a stable data signal. Although only two read column select lines READ CSL0 and READ CSL1 have been described with reference to this particular embodiment of FIG. 8; alternative embodiments may comprise a plurality of read column select lines as such shielding lines.

In the semiconductor memory device according to exemplary embodiments of the present invention, the signal line may be shielded by write column select lines. Accordingly, the signal line can be shielded from potential noise and may be operable with stable signal propagations. At the same time, layout area may be preserved by using the already present WRITE column select lines for additional purposes of shielding. Accordingly, extra shielding lines may not be required. By such examples, chip size may be reduced from what might otherwise be required for shielding.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device comprising:

a signal line for propagating an operation signal related to the operation of the semiconductor memory device;

a complementary signal line for propagating a complementary signal of the operation signal;

a plurality of read column select lines parallel to the signal line and the complementary signal line, respectively and operable to transmit a read column select signal, which controls transfer of a data signal of a bit line to a data line; and a plurality of write column select lines parallel to the signal line and the complementary signal line and interposed between the read column select lines and the two signal lines, the write column select lines operable to transmit a write column select signal, which controls transfer of the data signal of the data line to the bit line;

the write column select lines to be maintained at a predetermined logic level, respectively, during a read operation to shield the signal line and the complementary signal line from transitions of the read column select signal.

2. The device of claim 1, in which the operation signal comprises an output data signal of voltage swing relatively smaller than that of a CMOS level.

3. The device of claim 2, in which the logic level is a logic low level.

4. The device of claim 2, in which the logic level is a logic high level.

5. The device of claim 1, wherein the signal line and complementary signal line transmit a differential current mode signal.

6. A semiconductor memory device comprising:

a signal line for transmitting an operation signal related to the operation of the semiconductor memory device; a complementary signal line for transmitting a signal complementary to the operation signal;

a plurality of write column select lines in parallel with the signal line and the complementary signal line, respectively, the plurality of write column select lines to transmit a write column select signal, to control transfer of a data signal of a data line into a bit line; and a plurality of read column select lines in parallel with the signal line and the complementary signal line and interposed between the write column select lines and the two signal lines, the plurality of read column select lines to transmit a read column select signal to control transfer of the data signal of the bit line into the data line;

in which the read, column select lines to be maintained at predetermined logic levels, respectively, and during a write operation to shield the signal line and the complementary signal line from transitions of the write column select signal.

7. The device of claim 6, in which the operation signal is an input data signal of voltage swing relatively smaller than a CMOS voltage level.

8. The device of claim 6, in which the logic level comprises one of a logic low level and a logic high level.

9. The device of claim 6, wherein the signal line and complementary signal line transmit a differential current mode signal.

* * * * *

UNITED STATES PATENT AND TRADEMARK OFFICE
CERTIFICATE OF CORRECTION

PATENT NO. : 6,775,170 B2
DATED : August 10, 2004
INVENTOR(S) : Lee et al.

It is certified that error appears in the above-identified patent and that said Letters Patent is hereby corrected as shown below:

Column 7,
Line 35, "line, respectively and" should read -- line, respectively, and --.

Column 8,
Line 32, "the read, column" should read -- the read column --.

Signed and Sealed this

Thirty-first Day of May, 2005

JON W. DUDAS
*Director of the United States Patent and Trademark Office*